(12) United States Patent
Lin

(10) Patent No.: US 9,257,622 B2
(45) Date of Patent: Feb. 9, 2016

(54) LIGHT-EMITTING STRUCTURE

(71) Applicant: Jin-Ywan Lin, Taoyuan County (TW)

(72) Inventor: Jin-Ywan Lin, Taoyuan County (TW)

( * ) Notice: Subject to any disclaimer, the term of this patent is extended or adjusted under 35 U.S.C. 154(b) by 67 days.

(21) Appl. No.: 14/252,439

(22) Filed: Apr. 14, 2014

(65) Prior Publication Data

US 2015/0295150 A1    Oct. 15, 2015

(51) Int. Cl.
| | |
|---|---|
| *H01L 33/00* | (2010.01) |
| *H01L 33/62* | (2010.01) |
| *H01L 33/38* | (2010.01) |
| *H01L 33/32* | (2010.01) |
| *H01L 33/22* | (2010.01) |

(52) U.S. Cl.
CPC .............. *H01L 33/62* (2013.01); *H01L 33/22* (2013.01); *H01L 33/32* (2013.01); *H01L 33/387* (2013.01)

(58) Field of Classification Search
CPC ....... H01L 33/62; H01L 33/387; H01L 33/22; H01L 33/32
USPC .......................................................... 257/99
See application file for complete search history.

(56) References Cited

U.S. PATENT DOCUMENTS

| | | | | |
|---|---|---|---|---|
| 6,455,878 B1* | 9/2002 | Bhat | ....................... | H01L 33/56 257/103 |
| 2001/0032985 A1* | 10/2001 | Bhat | ................... | H01L 25/0753 257/88 |
| 2004/0188696 A1* | 9/2004 | Chen | ...................... | H01L 24/97 257/99 |
| 2005/0133806 A1* | 6/2005 | Peng | ....................... | H01L 33/20 257/99 |
| 2006/0208364 A1* | 9/2006 | Wang | ..................... | H01L 33/486 257/778 |
| 2007/0037327 A1* | 2/2007 | Herrick | ................. | H01L 29/407 438/151 |
| 2007/0096130 A1* | 5/2007 | Schiaffino | ........... | H01L 33/0079 257/98 |
| 2008/0054290 A1* | 3/2008 | Shieh | ...................... | H01L 33/38 257/99 |
| 2008/0101062 A1* | 5/2008 | Feng | ......................... | F21K 9/00 362/231 |
| 2008/0246047 A1* | 10/2008 | Hsu | ........................ | H01L 33/387 257/98 |
| 2010/0019247 A1* | 1/2010 | Joichi | ..................... | H01L 33/32 257/76 |
| 2010/0273331 A1* | 10/2010 | Chan | ....................... | H01L 33/22 438/694 |
| 2012/0208307 A1* | 8/2012 | Lee | ........................... | H01L 33/44 438/28 |
| 2013/0026519 A1* | 1/2013 | Huang | .................... | H01L 33/20 257/98 |
| 2013/0146915 A1* | 6/2013 | Huang | .................... | H01L 33/60 257/98 |
| 2014/0217436 A1* | 8/2014 | Hussell | .................. | H01L 33/62 257/98 |

* cited by examiner

*Primary Examiner* — Jarrett Stark
(74) *Attorney, Agent, or Firm* — Muncy, Geissler, Olds & Lowe, P.C.

(57) ABSTRACT

A light-emitting structure includes a package substrate and a light emitter disposed on the package substrate. The package substrate includes a carrier substrate and a plurality of metal units disposed on the carrier substrate. A distance between two arbitrary points on a periphery of the metal unit is defined as a peripheral endpoint distance. The light emitter includes a first electrical metal and a second electrical metal that have different electrical polarities and are separate from each other. A shortest distance between the first electrical metal and the second electrical metal is defined as an electrical metal interval. The electrical metal interval between the first electrical metal and the second electrical metal is greater than the longest peripheral endpoint distance of the metal unit.

9 Claims, 6 Drawing Sheets

LIGHT-EMITTING STRUCTURE

FIELD OF THE INVENTION

The present invention relates to a light-emitting structure, and more particularly to a light-emitting structure that involves no alignment during a flip-chip assembly process of a die and during a wafer-level flip-chip adhesion process.

BACKGROUND OF THE INVENTION

A light-emitting diode (LED) is a light-emitting element formed by a semiconductor material. In an LED, a photon is emitted by combining an electronic and a hole in the semiconductor to generate a spectrum having different frequencies. Offering features of having good color purity and a long life cycle as well as being mercury-free and power-saving, LEDs have gradually gained popularity in applications of illumination and backlight sources of display devices.

The packaging and bonding of an LED can be performed by two main methods—a wire bonding method, and a flip chip method. In the wire bonding packaging technique, a chip is placed on a substrate, and is combined to connecting points on the substrate by wire bonding. In the flip-chip packaging technique, bumps are grown on connecting points of a die, and the chip is flipped over to directly connect the bumps with a substrate. More specifically, during a packaging process for a flip-chip package structure, electrodes of a flip chip need to be aligned with a circuit pattern on a substrate to form electrical connection.

Further, metal adhesion for an LED chip is performed by two main methods—an all-surface metal adhesion method and a wafer-level flip-chip adhesion method. In the all-surface metal adhesion technique, a metal layer of a chip and a metal layer of a substrate are adhered to each other. In the wafer-level flip-chip adhesion method, metal bumps are grown on a chip, and the chip is flipped over to directly connect the metal bumps with metal on a substrate. The growth substrate is then removed to proceed to die manufacturing. More specifically, in the wafer-level flip-chip adhesion method, the metal bumps of the flip chip need to be aligned with the metal of a circuit pattern on a substrate to form electrical connection.

For both of the flip-chip package technique of dies and the wafer-level flip-chip adhesion technique, even a slightly error during the alignment procedure may result in short circuits. Further, manufacturing costs can be significantly increased as high-precision alignment apparatuses are extremely expensive.

SUMMARY OF THE INVENTION

Therefore the primary object of the present invention is to overcome the issue of increased manufacturing costs caused by the procedure of aligning an electrical metal of a flip chip in a conventional LED flip-chip structure with a circuit pattern of a carrier substrate before proceeding to subsequent processes.

To achieve the object, a light-emitting structure is provided. The light-emitting structure includes a package substrate, and a light emitter disposed on the package substrate. The package substrate includes a carrier substrate, and a plurality of metal units disposed on the carrier substrate. Each of the metal units has a contact surface, and a distance between two arbitrary points on a periphery of the contact surface is defined as a peripheral endpoint distance. The light emitter includes a first electrical metal and a second electrical metal, which have different electrical polarities and are separate from each other at a same side. A shortest distance between the first electrical metal and the second electrical metal is defined as an electrical metal interval. The first electrical metal has a first surface in contact with the plurality of contact surfaces to form electrical connection between them. The second electrical metal has a second surface in contact with the plurality of contact surfaces to form electrical connection between them. The electrical metal interval between the first electrical metal and the second electrical metal is greater than the longest peripheral endpoint distance of the contact surface.

In one embodiment, the contact surfaces are formed in a shape selected from a group consisting of a rectangle, a triangle, a cross and a circle.

In one embodiment, the metal units are disposed in an array arrangement on the carrier substrate.

In one embodiment, the metal units are separate from one another in a staggered arrangement on the carrier substrate.

In one embodiment, the first electrical metal is positive, and the second electrical metal is negative.

In one embodiment, the light emitter is a III-nitride (i.e., aluminum gallium indium nitride, AlGaInN) semiconductor light-emitting stacked layer.

In one embodiment, the carrier substrate is an electrically insulated silicon substrate or a highly heat-conductive ceramic substrate made of aluminum nitride (AlN) or boron nitride (BN).

In one embodiment, the light emitter further includes a rough surface at one side thereof opposite to the first electrical metal and the second electrical metal.

In one embodiment, the carrier substrate includes a first electrode and a second electrode disposed at one side thereof opposite to the metal units, and a first electrical connecting channel and a second electrical connecting channel penetrating through the carrier substrate. The first electrical connecting channel has two ends respectively connected to one metal unit and the first electrode. The second electrical connecting channel has two ends respectively connected to another metal unit and the second electrode.

In one embodiment, the light-emitting structure further includes a transparent growth substrate. The transparent growth substrate is disposed at one side of the light emitter opposite to the first electrical metal and the second electrical metal.

The present invention provides the benefits below. In the present invention, the metal units that are in contact and form electrical connection with the first electrical metal and the second electrical metal are provide on the carrier substrate, and the electrical metal interval between the first electrical metal and the second electrical metal is greater than the longest peripheral endpoint distance of the metal unit. Thus, when the first electrical metal is in contact with the metal units and the second electrical metal is in contact with the metal units, the first electrical metal and the second electrical metal are not short circuited. Therefore, when combining the package substrate with the light emitter, without involving an alignment procedure, the combining the package substrate and the light emitter may be placed along any direction as desired, thereby saving the costs of alignment apparatuses while also simplifying the die flip-chip package process and eliminating the package process of wafer-level flip chips to enhance manufacturing efficiency.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
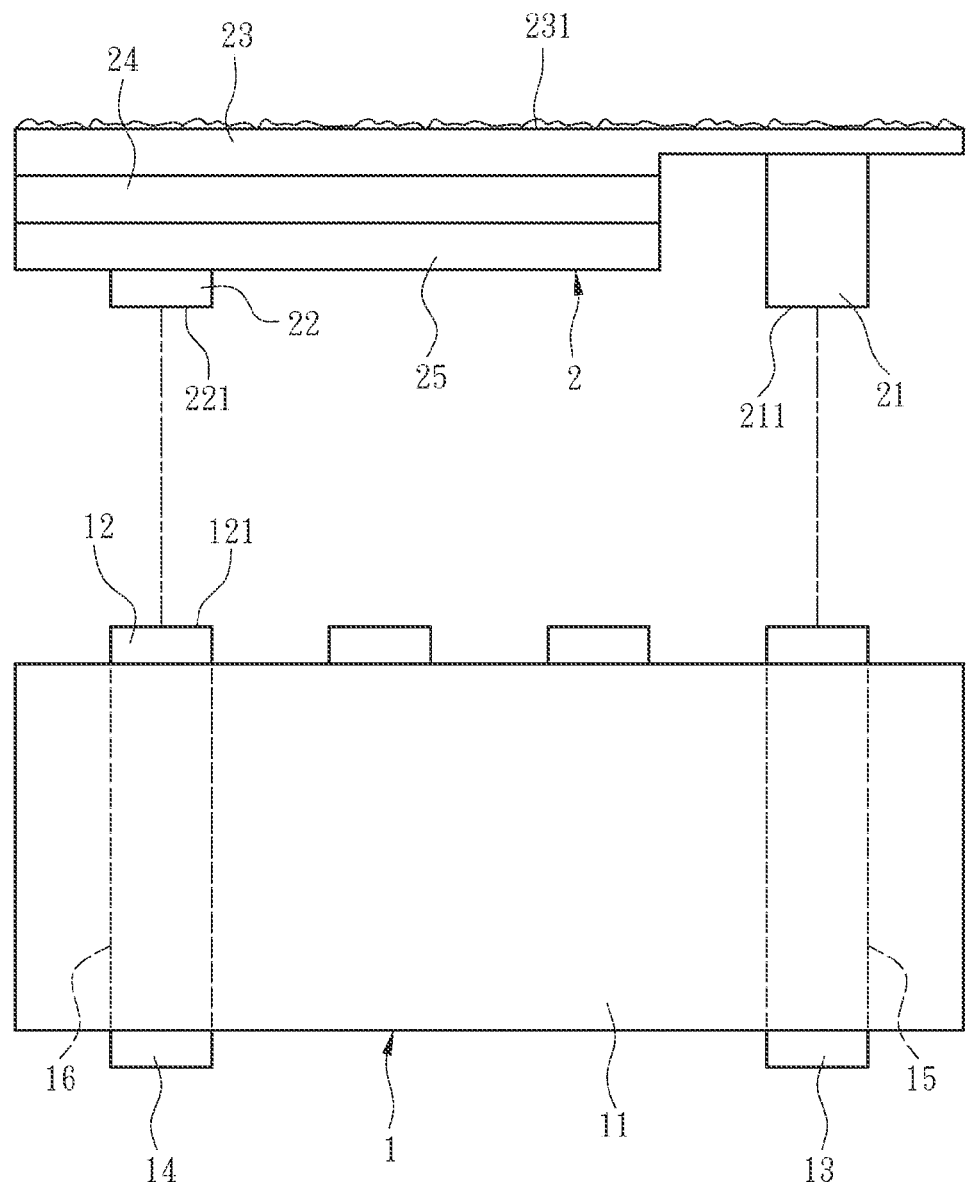
FIG. 1 is a schematic diagram of a structure according to a preferred embodiment of the present invention.

FIG. 1 shows a schematic diagram of a structure according to a preferred embodiment of the present invention. As shown in FIG. 1, a light-emitting structure of the present invention includes a package substrate 1, and a light emitter 2 disposed on the package substrate 1. The package substrate 1 includes a carrier substrate 11, a plurality of metal units 12 disposed on the carrier substrate 11, a first electrode 13 and a second electrode 14 disposed at one side of the carrier substrate 11 opposite to the metal units 12, and a first electrical connecting channel 15 and a second electrical connecting channel 16 penetrating through the carrier substrate 11. The first electrode 13 may be a p-type electrode or an n-type electrode, and the second electrode 14 may be an n-type electrode or a p-type electrode having a different electrical polarity from the first electrode 13. The first electrical connecting channel 15 has two ends respectively connected to one metal unit 12 and the first electrode 13. The second electrical connecting channel 16 has two ends respectively connected to another metal unit 12 and the second electrode 14. Each of the metal units 12 has a contact surface 121. The carrier substrate 11 may be an insulating material with good heat conductivity, and includes a group formed by at least one material selected from electrically insulated silicon, aluminum nitride (AlN) and chemical deposition vapor (CVD) diamond. For example, the carrier substrate 11 may be electrically insulated silicon substrate, or a highly heat-conductive ceramic substrate made of aluminum nitride (AlN) or boron nitride (BN), and the metal units 12 may be made of a metal or an alloy material such as gold, silver, aluminum or an alloy thereof.

The light emitter 2 emits beams when being driven by a voltage. A color of the beams is determined by the material of the light emitter 2, which may be a basic unit of an uncut wafer. That is to say, on the wafer are a plurality of light emitters 2 that combine with the package substrate 1. Alternatively, the light emitter 2 may be a pre-cut die that is directly combined with the package substrate 1. In one embodiment, the light emitter 2 is a III-nitride (i.e., aluminum gallium indium nitride, AlGaInN) semiconductor light-emitting stacked layer. More specifically, the light emitter 2 includes a first electrical metal 21 and a second electrical metal 22 that have different electrical polarities and are separate from each other, a first electrical semiconductor layer 23, an active layer 24, and a second electrical semiconductor layer 25. The active layer 24 is formed on the first electrical semiconductor layer 23, and the second electrical semiconductor layer 25 is formed on the active layer 24. A part of the second electrical semiconductor layer 25 and a part of the active layer 24 are etched and removed to reveal a part of the first electrical semiconductor layer 23. Further, the first electrical metal 21 is disposed on the first electrical semiconductor layer 25 to form an ohmic contact, and the second electrical metal 22 is disposed on the second electrical semiconductor layer 25 to form an ohmic contact with the second electrical semiconductor layer 25. The first electrical metal 21 and the second electrical metal 22 are made of a metal or an alloy material, such as gold, silver, aluminum, or an alloy thereof. The first electrical metal 21 and the second electrical metal 22 have a first surface 211 and a second surface 221, respectively.

Figure 2A:
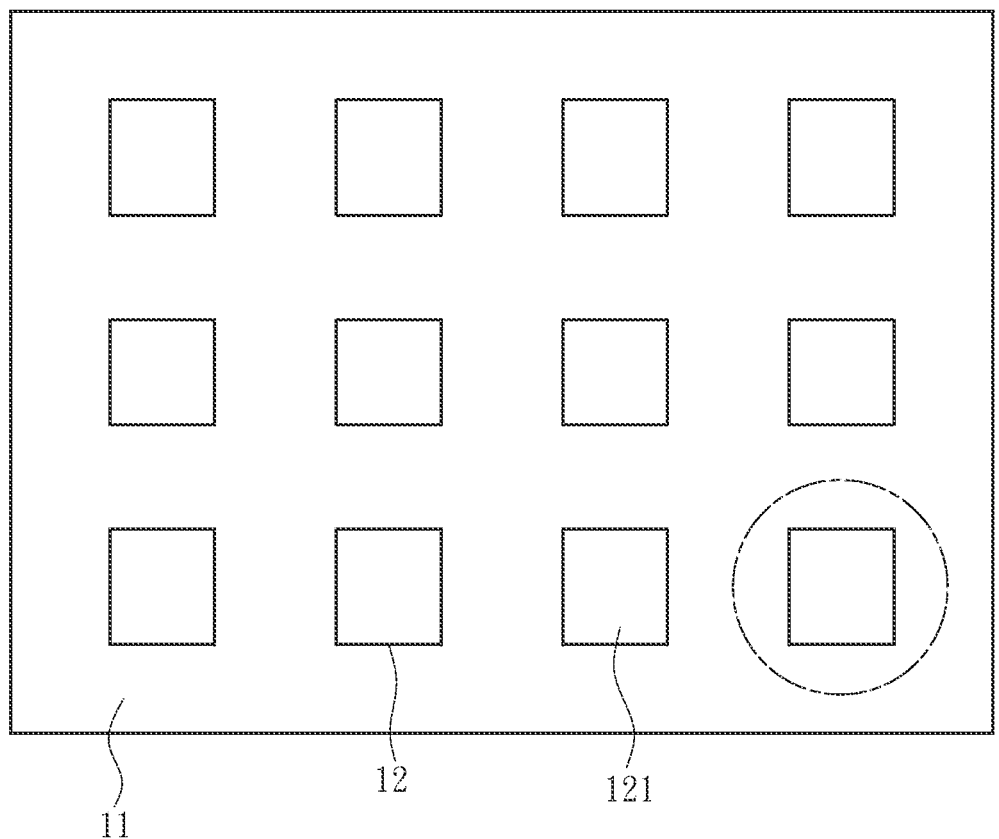
FIG. 2A is a top view of a package substrate according to a preferred embodiment of the present invention.
Figure 2B:
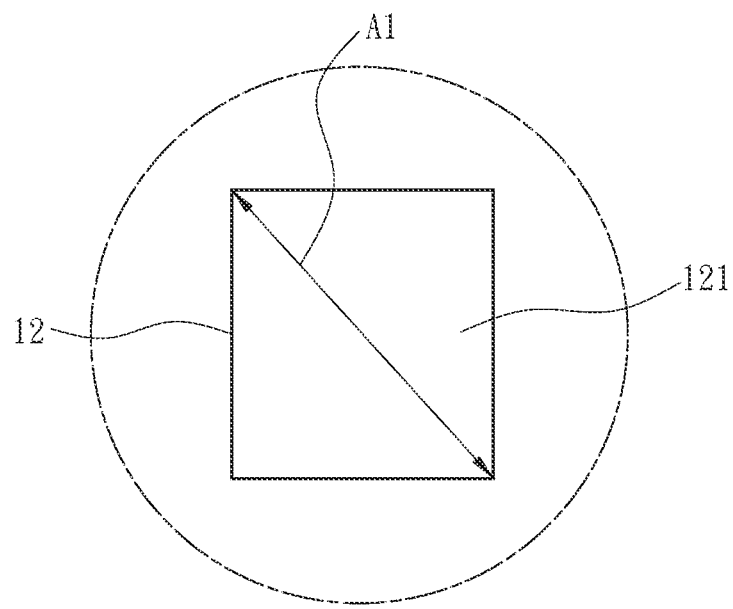
FIG. 2B is an enlarged schematic diagram of a metal unit according to a preferred embodiment of the present invention.
Figure 3:
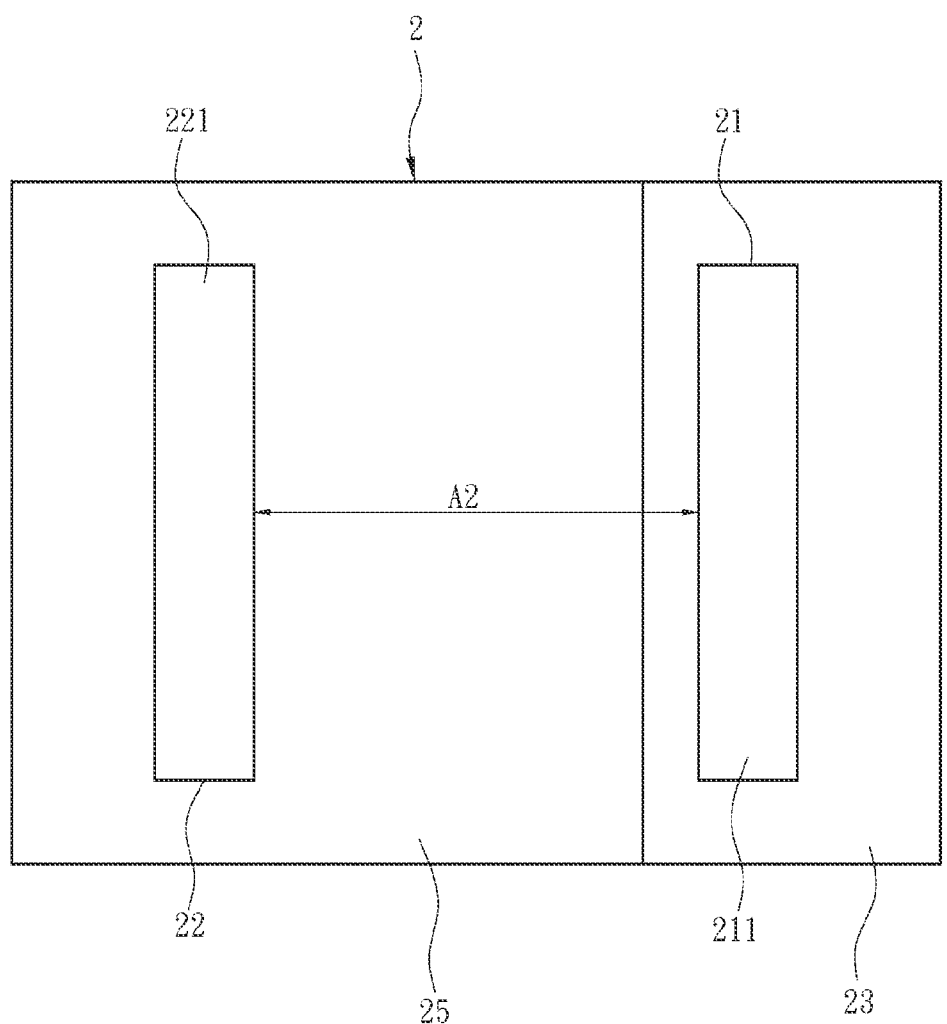
FIG. 3 is a bottom view of a light emitter according to a preferred embodiment of the present invention.
Figure 4:
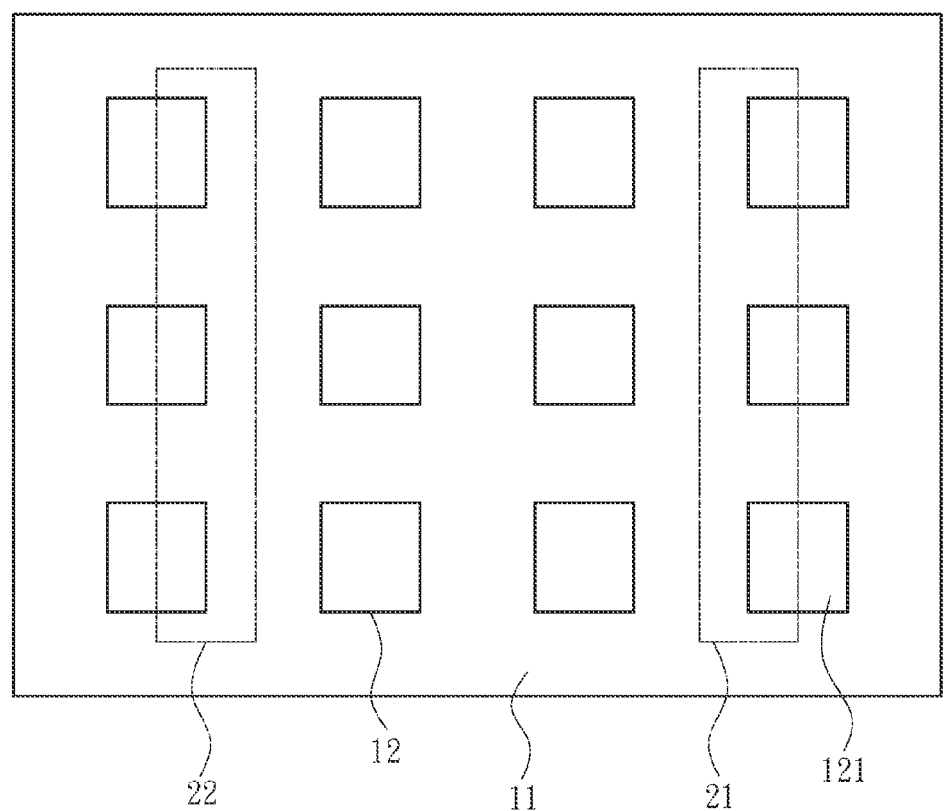
FIG. 4 is a schematic diagram according to a preferred embodiment of the present invention.

In one embodiment, as shown in FIG. 2A and FIG. 2B, the metal units 12 are disposed on the carrier substrate 11 in an array arrangement, and are not in contact with one another (as shown in FIG. 2A). A distance between two arbitrary points on a periphery of the contact surface 121 is defined as a peripheral endpoint distance A1 (as shown in FIG. 2B). The shape of the contact surface 121 is not limited, and may be a geometric shape such a rectangle, a triangle, a cross or a circle. In the embodiment, the shape of the contact surface 121 is a rectangle as an example. In the embodiment, the longest peripheral endpoint distance A1 is a length of a diagonal line of the rectangle. As shown in FIG. 3, the first electrical metal 21 and the second electrical metal 22 are separate from each other and are formed in a long strip shape. A shortest distance between the first electrical metal 21 and the second electrical metal 22 is defined as an electrical metal interval A2. For example, the first electrical metal 21 is positive and the second electrical metal 22 is negative, or the first electrical metal 21 is negative and the second electrical metal 22 is positive. The electrical metal interval A2 is greater than the longest peripheral endpoint distance A1 of the contact surface 121. As shown in FIG. 4, during a packaging process, the light emitter 2 is placed on the package substrate 1, such that the first surface 211 of the first electrical metal 21 is in contact with the contact surfaces 121 of the metal units 12 to form electrical connection between them, and the second surface 221 of the second electrical metal 22 is in contact with the contact surfaces 121 of the metal units 12 to form electrical connection between them. As the electrical metal interval A2 between the first electrical metal 21 and the second electrical metal 22 is greater than the longest peripheral endpoint distance A1 on the contact surface 121 of the metal unit 12, the first electrical metal 21 and the second electrical metal 22 do not contact the contact surface 121 of the same metal unit 12 under any angle. Therefore, when combining the package substrate 1 with the light emitter 2, without involving an alignment procedure, the package substrate 1 and the light emitter 2 may be placed along any direction as desired, thereby saving the costs of alignment apparatuses and enhancing manufacturing efficiency. The first electrical semiconductor 23 further includes a rough surface 231 generated by a roughening treatment. As such, light extraction efficiency can be increased to also enhance the overall light emitting efficiency of the light emitter 2.

Figure 5A:
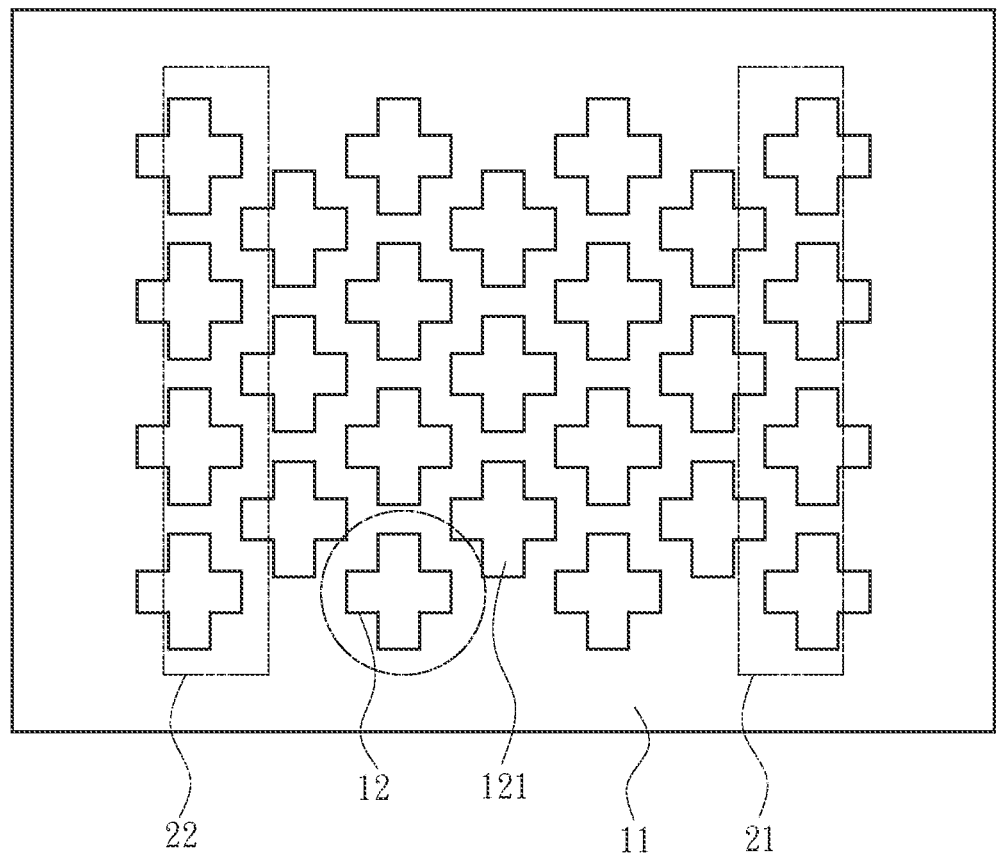
FIG. 5A is a top view of a package substrate according to another preferred embodiment of the present invention.
Figure 5B:
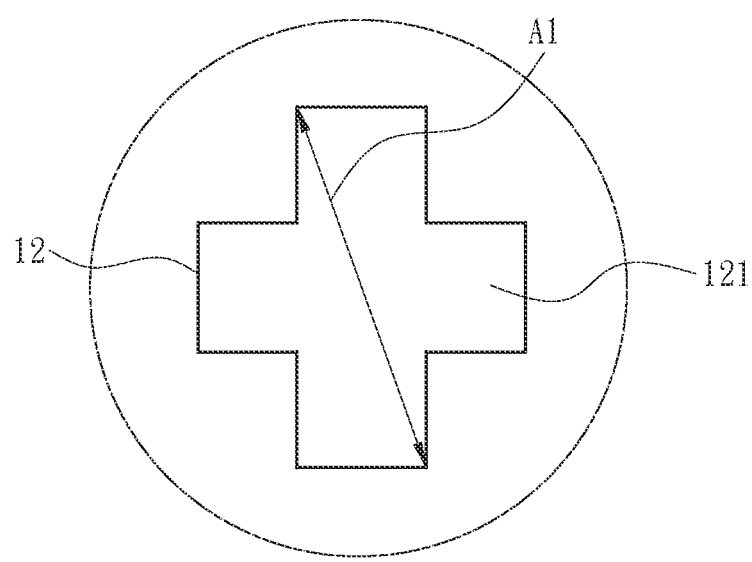
FIG. 5B is an enlarged schematic diagram of a metal unit according to another preferred embodiment of the present invention.

In another embodiment, as shown in FIG. 5A and FIG. 5B, the metal units 12 are cross-shaped, and are separate from one another in a staggered arrangement on the carrier substrate 11. In the embodiment, the longest peripheral endpoint distance A1 is the length of a longest diagonal line of the cross, and the electrical metal interval A2 is still greater than the longest peripheral endpoint distance A1. Thus, without involving an alignment procedure, the light emitter 2 may be similarly placed on the package substrate 1 along any direction.

Figure 6:
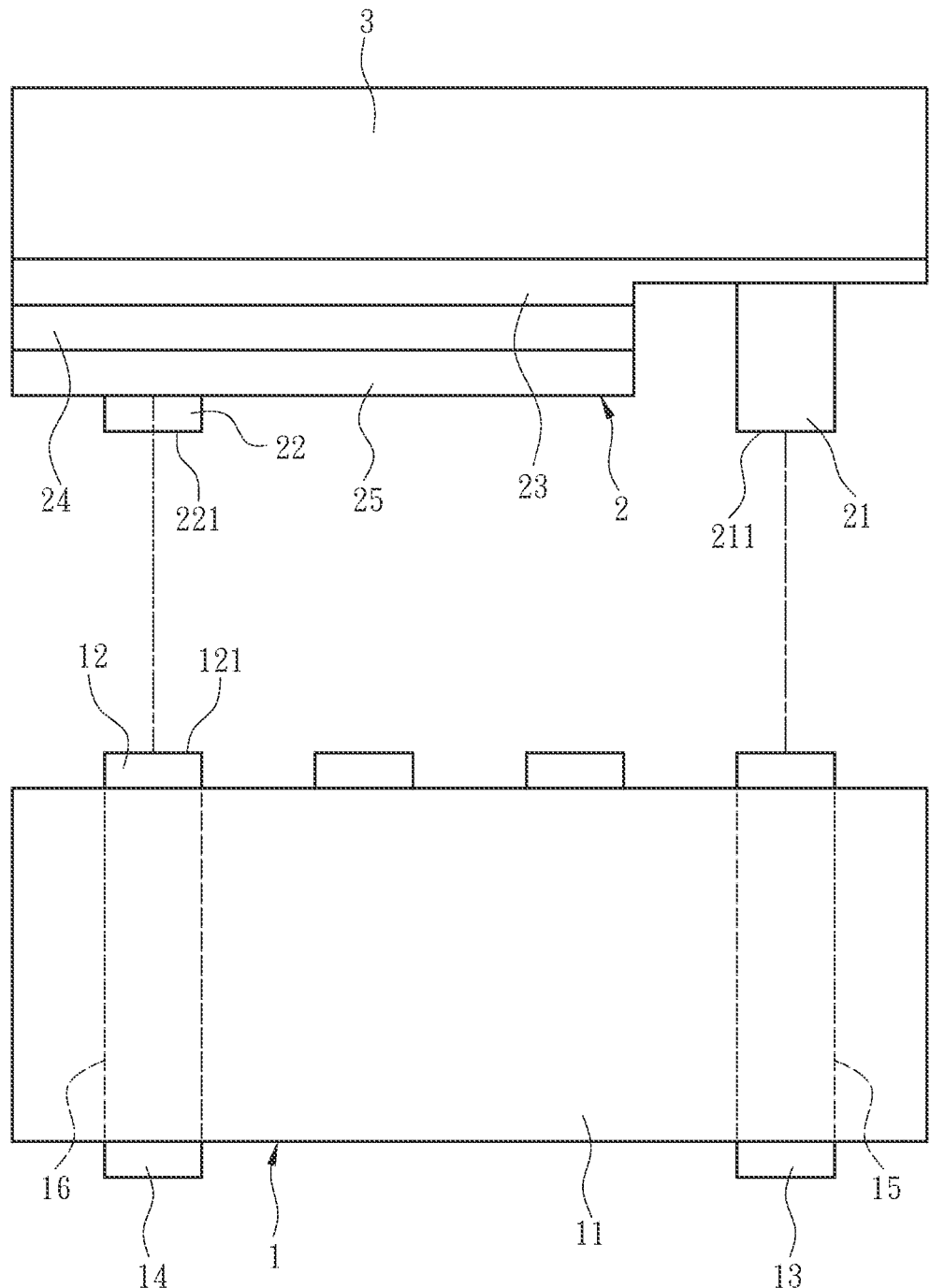
FIG. 6 is a schematic diagram of a structure according to yet another preferred embodiment of the present invention.

In another embodiment, as shown in FIG. 6, the light-emitting structure further includes a transparent growth substrate 3. The transparent growth substrate 3 is formed at one side of the light emitter 2 opposite to the first electrical metal 21 and the second electrical metal 22. The transparent growth substrate 3 is made of material selected from a group consisting of sapphire (aluminum oxide, $Al_2O_3$), gallium nitride (GaN) and silicon carbide (SiC). Through the transparent growth substrate 3, beams generated from the light emitter 2 are spread such that a light-emitting angle of the light-emitting structure is expanded.

In the present invention, the plurality of metal units 12 that are in contact and form electrical connection with the first electrical metal 21 and the second electrical metal 22 are provided on the carrier substrate 11, and the electrical metal interval A2 between the first electrical metal 21 and the second electrical metal 22 is greater than the longest peripheral endpoint distance A1 of the contact surface 121. Thus, when the first electrical metal 21 is in contact with the contact surfaces 121 of the metal units 12, the second electrical metal 22 is not in contact with the metal units 12 that are already in contact with the first electrical metal 21. Therefore, when packaging the package substrate 1 with the light emitter 2, without involving an alignment procedure, the package substrate 1 and the light emitter 2 may be placed along any direction as desired, thereby saving the costs of alignment apparatuses while also simplifying the die flip-chip package process and enhancing manufacturing efficiency.

What is claimed is:

1. A light-emitting structure, comprising:
a package substrate, comprising a carrier substrate and a plurality of metal units disposed on the carrier substrate, each of the plurality of metal units including a contact surface, a distance between two arbitrary points on a periphery of the contact surface being defined as a peripheral endpoint distance, the carrier substrate comprising a first electrode and a second electrode disposed at one side thereof opposite to the plurality of metal units, and a plurality of electrical connecting channels penetrating through the carrier substrate; and
a light emitter, disposed on the package substrate, comprising a first electrical metal and a second electrical metal that have different electrical polarities and are separate from each other, a shortest distance between the first electrical metal and the second electrical metal being defined as an electrical metal interval, the first electrical metal including a first surface in contact with the plurality of contact surfaces to form electrical connection between them, the second electrical metal including a second surface in contact with the plurality of contact surfaces to form electrical connection between them;
wherein the electrical metal interval between the first electrical metal and the second electrical metal is greater than the longest peripheral endpoint distance of the contact surface,
wherein the plurality of metal units includes a plurality of first metal units in contact with the first electrical metal, a plurality of second metal units in contact with the second electrical metal and a plurality of third metal units located between the first electrical metal and the second electrical metal without contact with the first electrical metal, the second electrical metal and the plurality of electrical connecting channels, and
wherein the plurality of electrical connecting channels includes a plurality of first electrical connecting channels, each including two ends respectively connected to one of the plurality of first metal units and the first electrode, and a plurality of second electrical connecting channels, each including two ends respectively connected to one of the plurality of second metal units and the second electrode.

2. The light-emitting structure of claim 1, wherein the contact surfaces are formed in a shape selected from a group consisting of a rectangle, a triangle, a cross and a circle.

3. The light-emitting structure of claim 1, wherein the metal units are separate from one another and are disposed in a staggered arrangement on the carrier substrate.

4. The light-emitting structure of claim 1, wherein the metal units are disposed in an array arrangement on the carrier substrate.

5. The light-emitting structure of claim 1, wherein the first electrical metal is positive, and the second electrical metal is negative.

6. The light-emitting structure of claim 1, wherein the light emitter is a III-nitride semiconductor light-emitting stacked layer.

7. The light-emitting structure of claim 1, wherein the light emitter further comprises a rough surface at one side thereof opposite to the first electrical metal and the second electrical metal.

8. The light-emitting structure of claim 1, wherein the carrier substrate is a silicon substrate or a highly heat-conductive ceramic substrate made of aluminum nitride (AlN) or boron nitride (BN).

9. The light-emitting structure of claim 1 further comprising a transparent growth substrate disposed at one side of the light emitter opposite to the first electrical metal and the second electrical metal.

* * * * *